United States Patent
Ward et al.

(10) Patent No.: US 6,173,758 B1
(45) Date of Patent: Jan. 16, 2001

(54) PIN FIN HEAT SINK AND PIN FIN ARRANGEMENT THEREIN

(75) Inventors: Terence G. Ward, Redondo Beach; Scott D. Downer, Torrance, both of CA (US)

(73) Assignee: General Motors Corporation, Detroit, MI (US)

(*) Notice: Under 35 U.S.C. 154(b), the term of this patent shall be extended for 0 days.

(21) Appl. No.: 09/366,097

(22) Filed: Aug. 2, 1999

(51) Int. Cl.[7] .................................................. H05K 7/20
(52) U.S. Cl. .................. 165/80.3; 165/80.4; 165/185; 361/697; 361/710
(58) Field of Search ................... 165/185, 80.3, 165/80.4; 361/697, 704, 710

(56) References Cited

U.S. PATENT DOCUMENTS

| | | | |
|---|---|---|---|
| 2,892,618 | * 6/1959 | Holm | 165/185 |
| 5,158,136 | * 10/1992 | Azar | 165/185 |
| 5,195,576 | * 3/1993 | Hatada et al. | 165/80.3 |
| 5,845,399 | * 12/1998 | Dewar et al. | 29/890.03 |

* cited by examiner

Primary Examiner—Allen Flanigan
(74) Attorney, Agent, or Firm—Anthony Luke Simon

(57) ABSTRACT

A pin fin heat sink having mixed geometry pin fin configurations is presented. The mixed geometry pin fin configuration are designed to optimize the positive attributes of each individual pin fin geometry to provide a low cost overall system and provide better system performance in high flow rate systems. In an exemplary embodiment, the pin fin heat sink comprises a base surface having a plurality of pin fins perpendicular to and protruding therefrom. The plurality of pin fins actually comprises a plurality of pin fins having a first configuration and a plurality of pin fins having a second configuration. The second configuration pin fins are intended to streamline any turbulence created by the first configuration pin fins which are located upstream of the second configuration pin fins. Preferably, the first configuration comprises substantially circular shaped pin fins and the second configuration comprises substantially elliptical shaped pin fins.

2 Claims, 1 Drawing Sheet

PIN FIN HEAT SINK AND PIN FIN ARRANGEMENT THEREIN

TECHNICAL FIELD

This invention relates to an apparatus for dissipating heat from a surface and more specifically, to pin fin heat sinks and arrangement designs for the pin fins.

BACKGROUND OF THE INVENTION

Heat sinks comprise extended surfaces that are used to enhance cooling of heat dissipating surfaces. By increasing the overall surface area exposed to a cooling medium (fluid), the rate of heat transfer may be increased. Heat sinks may be fabricated using a variety of materials which employ a number of designs which act to enhance the cooling of the heat dissipating surfaces. Generally, the designs of the heat sinks are intended to decrease the impedance of the fluid flow through the heat sink and, thereby, reduce pressure losses. One commonly used heat sink apparatus is a pin fin heat sink. Pin fin heat sinks are also generally designed to maximize surface area and induce turbulent flow near the pin fins.

A conventional pin fin heat sink apparatus includes a base surface having a plurality of pin fins perpendicular to and protruding from the base surface. The heat sink apparatus is designed so that fluid flows through the plurality of pins which act to enhance the cooling of the heat dissipating surfaces. The plurality of pin fins may be provided in staggered rows on the base surface or the pin fins may be in equally aligned rows on the base surface. Conventional pin fin heat sink apparatuses have used a number of types of pin fins which have a variety of shapes, including, square, triangular, rectangular, diamond, circular, or helical. Typically, a single type of pin fin is used to exchange heat to the cooling medium.

As is known, one of the associated limitations of a heat sink apparatus is that the fluid flow loses a significant amount of its inertial force after entering the heat sink apparatus at one side and the fluid tends to slow as the fluid encounters rows of pin fins and flows toward an opposite side of the heat sulk apparatus. A circular pin fin design which is used in many conventional heat sinks works very well at lower flow rates. However as the flow rate of the system increases, a pressure drop begins to rapidly increase in the heat sink apparatus. Each circular pin fin creates a turbulent wake on the downstream side of the pin at high flow rates contributing to the system pressure drop. In effect, the circular pin fin creates more turbulence than is needed at high flow rates and the turbulence within the heat sink prevents the fluid from effectively flowing through the heat sink increasing the inefficiency of the heat transfer between the pin fin and the cooling medium (fluid). Prior heat fin apparatuses which include an elliptical pin fin design generally do not cause a large drop in pressure; however, the elliptical shape of the pin fin may not cause enough turbulence to provide optimal heat transfer between the pin fin and the cooling medium.

Consequently, there is a need to provide a pin fin arrangement in a heat sink apparatus which offers near optimal heat transfer at high flow rates.

SUMMARY OF THE INVENTION

The present invention comprises a pin fin heat sink and more specifically, relates to mixed geometry pin fin configurations which optimize the positive attributes of each individual pin fin geometry to provide a low cost overall system and provide better system performance in high flow rate systems. In an exemplary embodiment, the pin fin heat sink comprises a base surface having a plurality of pin fins perpendicular to and protruding therefrom. The plurality of pin fins actually comprises a plurality of pin fins having a first configuration and a plurality of pin fins having a second configuration. The first configuration pin fins are selected so that the geometric cross section of the pin fins causes turbulence as the fluid encounters the pin fins and the second configuration pin fins are selected so that the geometric cross section is such that the pin fins help streamline the turbulent fluid so that the fluid continues to move through the heat sink. Preferably, the first configuration comprises substantially circular shaped pin fins and the second configuration comprises substantially elliptical shaped pin fins.

In accordance with one exemplary embodiment of the present invention, the substantially circular shaped pin fins and the substantially elliptical shaped pin fins are arranged in staggered rows in which adjacent rows include pin fins having different configurations. In other words in the one exemplary embodiment, the heat sink includes an alternating pin fin design, wherein at least one row of the substantially circular pin fins alternates with at least one row of substantially elliptical pin fins. In a preferred embodiment, the pin fin configuration comprises disposing two rows of substantially elliptical pin fins downstream from a row of substantially circular pin fins. This alternating pattern is repeated over the base surface to form the heat sink of the present invention.

The above-described alternating pin fin arrangement is designed to reduce the pressure drop observed in high flow rate systems while at the same time, the mixed geometry arrangement creates enough turbulence to provide near optimal heat transfer at high flow rates and high Reynolds number conditions.

The above-described and other features and advantages of the present invention will be appreciated and understood by those skilled in the art from the following detailed description, drawings, and appended claims.

BRIEF DESCRIPTION OF THE DRAWINGS

The present invention will now be described by way of example with reference to the following Figures, which are meant to be exemplary, not limiting, and in which.

DETAILED DESCRIPTION OF THE INVENTION

Figure 1:
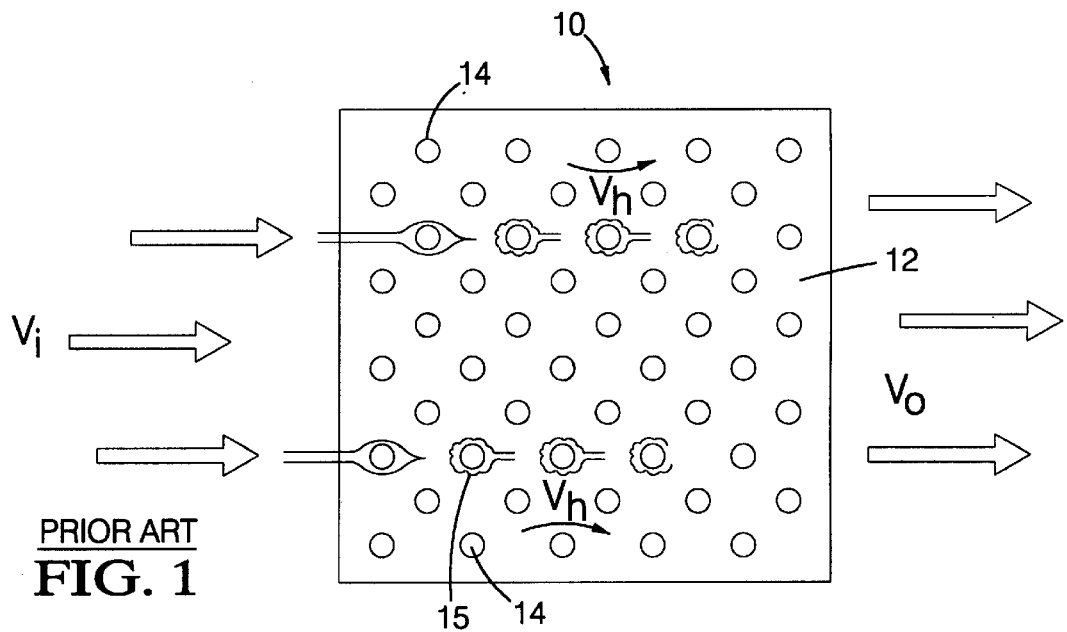
FIG. 1 is a top plan view of a prior art pin fin heat sink illustrating fluid flow.

Referring to FIG. 1, a conventional circular pin fin heat sink of the prior art is generally indicated at 10. FIG. 1 is a top plan view of heat sink 10 showing fluid flow (gas or liquid) relative to heat sink 10. Heat sink 10 comprises a base surface 12 and a plurality of pin fins 14 which have a circular geometric configuration. Circular pin fins 14 are perpendicular to and protrude from base surface 12. In FIG. 1, the normal fluid flow is in a left-to-right direction, as indicated by the arrows, and the initial velocity of the fluid prior to flowing through heat sink 10 is $V_i$. As the fluid flows into heat sink 10 it begins to slow down to a velocity of local $V_h$ after encountering typically several rows of the plurality of pin fins 14 before exiting at velocity $V_o$. This arises in part because the circular pin fins 14 create turbulent wakes 15, as shown in FIG. 1, downstream from individual circular pin fins which disrupts the fluid flow through heat sink 10. As fluid continues to contact successive rows of pin fins 14, the pressure of the fluid continues to decrease. As is known in the art, as fluid flows along the surface area of the individual circular pin fins 14, the velocity of the fluid is dynamic and changes as the fluid flows around the individual circular pin fin 14. The velocity profile of the fluid flow also includes a negative velocity vector portion proximate the surface area of circular pin fins 14 where the fluid passes approximately the 90° point of the circular pin fins 14 (this is approximately the 12 o'clock position of pin fins 14 in FIG. 1). The negative velocity vector helps to create the turbulent wake around circular pin fins 14 and more specifically, downstream of circular pin fins 14.

Some turbulence is desired near the pin fins 14 as it permits the fluid to remain in greater contact with the circular pin fins 14 resulting in a more efficient heat transfer between the circular pin fins 14 and the cooling medium (fluid). The turbulence allows more fluid to come into contact with circular pin fins 14 resulting in mixing of warm fluid with cooler fluid.

Unfortunately as the initial flow rate $V_i$ increases, the turbulence 15 downstream from around the circular pin fins 14 becomes more pronounced and the pressure of the fluid continues to significantly decrease as the fluid flow is more turbulent and the net velocity of the pin fins 14 decrease. As a result of excess turbulence, fluid entering from the left does not easily flow through the rows of circular pin fins 14 and the fluid is forced to flow upward and out of the top of circular pin fins 14 or the fluid is directed to the sides of heat sink 10 rather than flowing completely through circular pin fins 14. This results in an ineffective heat transfer because the fluid does not completely flow through and contact a substantial number of rows of circular pin fins 14 which act as the principal heat transfer mechanism of heat sink 10.

Figure 2:
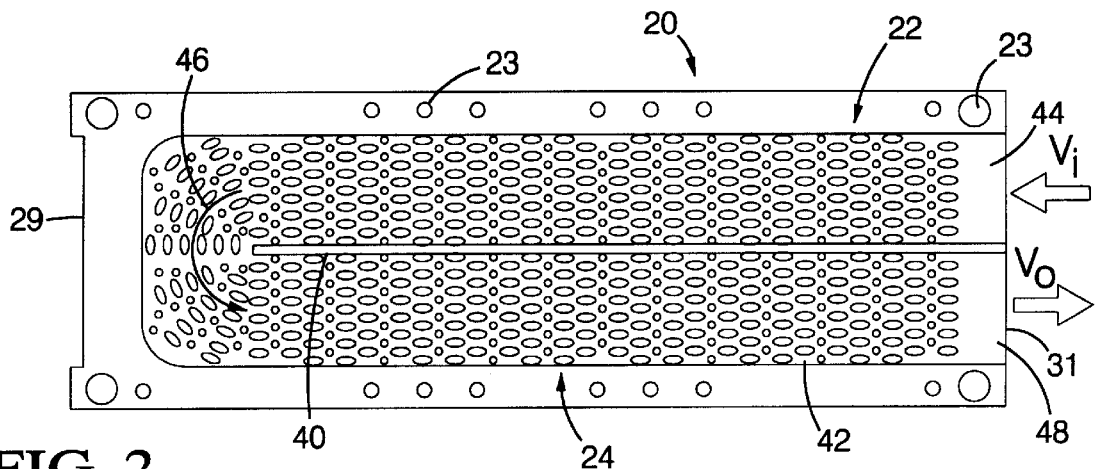
FIG. 2 is a top plan view of a pin fin heat sink embodying a first embodiment of the present invention.
Figure 3:
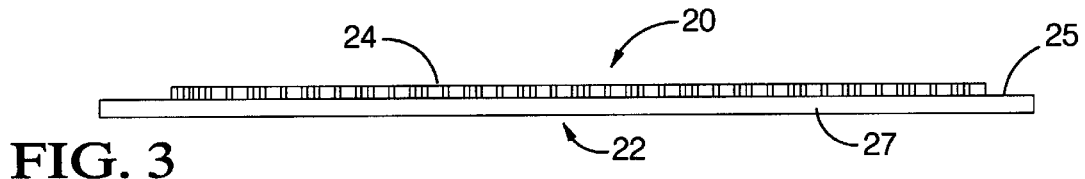
FIG. 3 is a side elevation view of the pin fin heat sink of FIG. 2.

Referring to FIGS. 2–3, a pin fin heat sink according to the present invention is generally designated at 20. Heat sink 20 includes a base 22 which in an exemplary embodiment comprises a base plate. Base 22 includes a first surface 25 and an opposing second surface 27. Base 22 includes a plurality of pin fins 24 perpendicular to and protruding from first surface 25 of base 22. Base 22 is shown with a plurality of apertures 23 formed therein and extending along first and second ends 29 and 31 of base 22. The plurality of apertures 23 are designed to receive fasteners (not shown) which permit second surface 27 of base 22 to be mounted on a heat dissipating surface. It being understood that the heat is transferred from the heat dissipating surface to second surface 27 and then to the plurality of pin fins 24 extending from first surface 25. Exemplary heat dissipating surfaces include but are not limited to an electrical component or motor vehicle component, etc. While pin fin heat sink 20 is shown in the Figures as including base 22 for mounting to another component, pin fin heat sink 20 can be made an integral part of the heat dissipating surface with the plurality of pin fins 24 protruding directly from the heat dissipating surface. Heat sink 20 is intended for use with suitable heat dissipating fluids which include incompressible fluids, e.g., liquids, and compressible fluids, e.g., gasses. Preferably, heat sink 20 is used with incompressible fluids, e.g., liquids, such as water or oil.

As best shown in FIG. 2, the present invention provides an improved pin fin arrangement in heat sink 20 which advantageously decreases system pressure drop in high flow rate systems which previously suffered from excessive turbulence which resulted in rapidly increasing pressure drops as the flow rate of the system is increased. The pin fin arrangement of the present invention is intended to decrease the system pressure drop while at the same time maintaining and optimizing the amount of turbulence in heat sink 20. As seen in FIG. 2, the normal fluid flow as the fluid enters heat sink 20 is indicated by the directional arrow and the initial velocity is $V_i$. While the plurality of pin fins 24 is illustrated as being arranged in staggered rows; it is within the scope of the present invention that the plurality of pin fins 24 could be aligned in rows on base 22 in a non-staggered manner. A staggered row pattern is preferred because this arrangement forces the fluid to contact as many of the plurality of pin fins 24 as possible as the fluid flows through the rows.

As previously mentioned, a pin fin design solely utilizing substantially circular pin fins design works well in a heat transfer apparatus, such as heat sink 20, because its shape permits the fluid to flow around the surfaces of the pin fin, while at the same time, substantially circular pin fins create an amount of turbulence which causes the fluid (cooling medium) to remain in contact with the substantially circular pin fins for an amount of time which results in an efficient heat transfer from the substantially circular pin fins to the cooling medium (fluid). However, heat sinks which employ only substantially circular pin fins have the associated disadvantage that as the flow rate increases (high flow rate systems), the amount of downstream turbulence also increases in the heat sink. Generally, the turbulence in the heat sink is in the form of turbulent wakes on the downstream side of the substantially circular pin fins. These turbulent wakes contribute to the system pressure drop because as the fluid successively contacts rows of circular pin fins, the pressure of the fluid continues to decrease. In effect, at higher flow rates, the substantially circular pin fins contribute to the system pressure drop, which in turn increases the power requirements of the system. The power requirement increases so that a minimum fluid pressure within the system is maintained.

Heats sinks which employ only substantially elliptical pin fins will generally not cause a large pressure drop in the system, but the substantially elliptical pin fins may not create enough turbulence to provide optimal heat transfer. Because of the shape of the substantially elliptical pin fins, the fluid passes through the heat sink at such a velocity that the fluid does not sufficiently remain in contact with surfaces of the substantially elliptical pin fins. This results in a less than optimal heat transfer between the substantially elliptical pin fins and the cooling medium (fluid). The present invention is designed to reduce or disrupt the thickness of the boundary layer of a respective pin fin causing more mixing of the fluid which leads to greater heat exchange.

In the exemplary embodiment shown in FIG. 2, the plurality of pin fins 24 of heat sink 20 actually comprises a plurality of pin fins of a first configuration 26 (first geometric cross section) and a plurality of pin fins of a second configuration 28 (second geometric cross section), both of which are arranged on base 22 and protrude therefrom. In accordance with the present invention, heat sink 20 is arranged so that pin fins of the first configuration 26 are designed to produce turbulence and pin fins of the second configuration are designed to streamline and keep the fluid flowing after it becomes turbulent. In a preferred embodiment, the plurality of pins fins having a first configuration 26 comprises pin fins having a substantially circular cross section and the plurality of pin fins having a second configuration 28 comprises pin fins having a substantially elliptical cross section. It being understood that these specific gleomctric cross sections are merely exemplary in nature and not limiting and it is within the scope of the present invention that other geometric cross sectional pin fin combinations may be used so long as one pin fin configuration creates turbulence and the other acts to streamline the fluid flow and reduce the turbulence. The substantially circular fin pins 26 and the substantially elliptical fin pins 28 are shown as being provided in a staggered row configuration relative to base 22. As used herein, a row is defined as a plurality of pin fins adjacent each other along a single plane. The staggered row configuration is a preferred pin fin configuration of the present invention because it forces the fluid to contact as many pin fins 24 as possible as the fluid flows through heat sink 20. The substantially circular pin fins 26 and the substantially elliptical fin pins 28 are arranged on base 22 so that in a preferred embodiment, an alternating design pattern is provided. At least one row of circular pin fins 26 alternates with at least one row of elliptical fin pins 28 to form the alternating design of the present invention.

As shown in FIG. 2, heat sink 20 is configured so that an alternating arrangement of one row of substantially circular pin fins 26 for every two rows of substantially elliptical pin fins 28 is presented. In other words a row of substantially circular pin fins 26 is provided on base 22 and then sequentially, two rows of substantially elliptical pin fins 28 are provided downstream from the row of circular pin fins 26, all fin pins being in a staggered row configuration. In this embodiment, the rows are arranged perpendicular to fluid flow along base surface 20. Furthermore, substantially elliptical pin fins 28 are aligned with the fluid flow so that the fluid is streamlined by the elliptical shape of pin fins 28. It being understood that there are a variety of alternating elliptical and circular pin fin designs which are within the scope of the present invention. For example, the alternating arrangement may comprise two rows of substantially circular pin fins 26 for every two rows of substantially elliptical pin fins 28 or alternatively, three rows of substantially elliptical pin fins 28 for every one row of substantially circular pin fins 26 may be provided on base 22. These alternative arrangements are described for purpose of illustration and in no way limit the scope of the present invention.

By providing heat sink 20 with a mixed pin fin configuration, heat sink 20 is able to optimize the positive attributes of each individual geometry to provide the best overall system performance for heat sink 20. The alternating elliptical and circular pin fin design is merely one example of a mixed geometry pin fin configuration of heat sink 20 of the present invention. The alternating elliptical and circular pin fin design provides a decrease in system pressure drop in high flow rate systems. Furthermore, the alternating elliptical and circular pin fin design of heat sink 20 approaches the thermal performance of a straight pin fin design but with a much lower pressure drop being realized in the overall system. A lower pressure drop in the overall system will translate into lower system power requirements, which include but are not limited to the use of a smaller pump and lower overall cost involved in operation of the system.

The mixed geometry pin fin configuration of the present invention, and more specifically, the alternating substantially circular pin fins 26 and substantially elliptical pin fins 28, is intended to optimize the turbulence created by the upstream pin fin configuration while at the same time reducing the decrease in pressure drop in the system. In the embodiment illustrated in FIG. 4, the alternating substantially circular pin fins 26 and substantially elliptical pin fins 28 take advantage of the turbulent affect that the substantially circular pin fins 26 create. The turbulent flow behind (downstream) the substantially circular pin fins 26 creates a thinner boundary layer for the following row of substantially elliptical pin fins 28 which in turn helps to improve conductive heat transfer from pin fins 26 and 28 to the fluid. In effect, by placing one or more rows of substantially elliptical pin fins 28 downstream from one or more rows of substantially circular pin fins 26, the fluid in the turbulent wakes is streamlined and at least partially realigned by the elliptical nature of pin fins 28 and thus the turbulent wakes are reduced and the fluid continues to flow in a direction toward the right. Consequently, the above-described stagnant portions present in conventional heat sinks are substantially eliminated or alleviated by the pin fin arrangement of the present invention.

After the fluid is at least partially streamlined by the substantially elliptical pin fins 28, the fluid flows and encounters a row of substantially circular pin fins 26 which produce downstream turbulence. Because of the repeating nature of substantially circular and elliptical pin fins 26 and 28, the fluid is repeatedly at least partially streamlined after turbulent wakes are created. This arrangement permits a more optimal amount of turbulence to be produced; however, the associated disadvantages of excess turbulence, such as stagnation, are alleviated or eliminated by the present pin fin arrangement. This is especially true in systems having a high flow rate.

The next effect of an alternating arrangement of substantially circular pin fins 26 and substantially elliptical pin fins 28 is low pressure drop combined with enough turbulence to provide near optimal heat transfer at high flow rates and high Reynolds number conditions. As is known in the art, a Reynolds number is a dimensionless number which is critical in the design of a system in which the effect of viscosity is important in controlling the velocities or the flow pattern of a fluid. Because the pin fin arrangement of the present invention produces a low pressure drop, the overall system requires less power. This translates into being able to use a smaller pump in the system and provides a lower cost system. The present invention is particularly suited for use with high power devices having high Reynolds number (>2000) flow rates.

In other words, in accordance with the present invention, the plurality of pin fins of the first configuration 26 create a predetermined amount of turbulence in heat sink 20 and the plurality of pin fins of the second configuration 28 are designed to at least partially streamline this turbulence and keeps fluid traveling at a predetermined velocity prior to the fluid encountering downstream additional pin fins of the first configuration 26 downstream. This process is repeated along the base surface of the heat sink so that the turbulence is repeatedly at least partially streamlined resulting in the turbulence being less stagnant.

Accordingly, the present invention teaches the use of mixed pin fin configurations in heat sink 20. While in a preferred and illustrated embodiment, base 22 includes substantially circular and substantial elliptical pin fins 26 and 28 , respectively, it is within the scope of the present invention that alternative pin fin configurations may be used in heat sink 20. For example, base 22 may include a plurality of elliptical pin fins 28 and a plurality of semi-circular pin fins (not shown) in which the arcuate portion of the semi-circular pin fin faces the fluid flow. Other pin configurations, including but not limited to triangular, diamond, helical and square, may be used so long as the arrangement of pin fins is designed to streamline excessive turbulence created by upstream pin fins having a first configuration before the fluid encounters first configuration pin fins located downstream. One additional advantage of using substantially elliptical pin fins 28 is that the casting process is made easier because of the elliptical configuration.

Base 22 and the plurality of pin fins 24 are formed of any suitable material and a preferred method of manufacturing pin fin heat sink 20 is a mold casting process. One preferred material is aluminum or copper. It being understood that it is within the scope of the present invention that other methods of manufacture may be used to produce the pin fin arrangement of the present invention.

Now referring to FIG. 2 which illustrates one exemplary embodiment of heat sink 20 which is commonly referred to as a two pass heat sink apparatus. A partial divider 40 separates preselected segments of a heat sink passageway 42 so that heat sink passageway 42 is generally in the shape of a U and fluid enters at second end 31 at an intake 44 and flows in the direction of the arrow. The initial velocity is $V_i$. The fluid passes through rows of pin fins 26 and 28 before encounter a U-turn segment 46 of heat sink passageway 42 which causes the fluid to flow in an opposite direction as it flows to an exit 48 which is also located at second end 31. As shown in FIG. 3, partial divider 40 defines intake 44 and exit 48 and forces fluid to enter heat sink 20 at intake 44 and not flow into exit 48. The velocity of the fluid as it exits heat sink 20 at 48 is $V_o$. At U-turn segment 46, pin fins 26 and 28 extend in a radial manner outward from one end of partial divider 40. As is known in the art, for incompressible fluids $V_i = V_o$.

Figure 4:
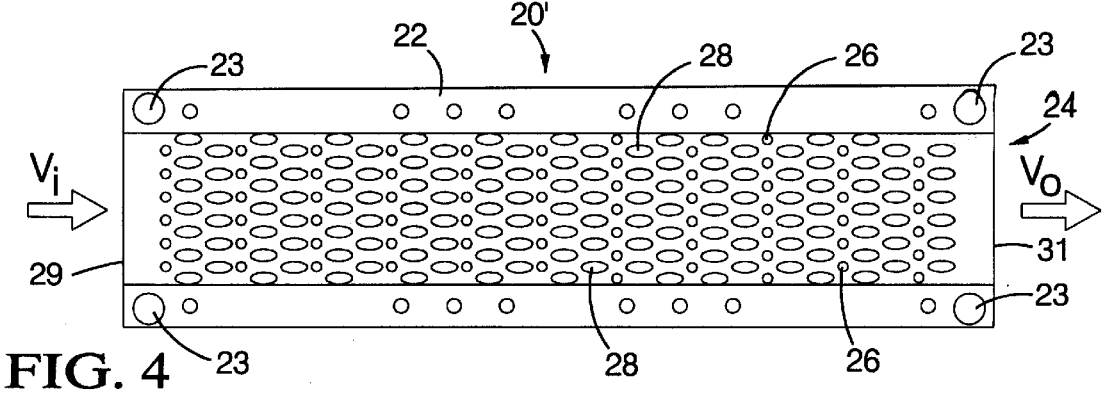
FIG. 4 is a top plan view of a pin fin heat sink embodying a second embodiment of the present invention.

Now turning to FIG. 4 which illustrates a heat sink of a second embodiment and is generally indicated at 20'. Heat sink 20' is very similar to heat sink 20 and differs only in that heat sink 20' is a single pass heat sink. In this embodiment, the fluid enters at first end 29 and flows in the direction indicated by the arrow towards second end 31. The fluid exits at second end 31 after having passed through a plurality of rows of substantially circular pin fins 26 and substantially elliptical pin fins 28. Because heat sink 20' is a single pass heat sink, partial divider 40 is eliminated. It being understood that heat sink 20 may have different designs so long as the plurality of pin fins are arranged on base 22 in accordance with the teachings of the present invention.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. An apparatus for dissipating heat, comprising:
   a surface over which an incompressible fluid flows;
   a first plurality of pin fins having a first geometric cross section protruding from said surface, the first geometric cross section producing turbulence in the incompressible fluid flows, wherein the first plurality of pin fins are arranged in first rows comprising only the first plurality of pin fins having the first geometric cross section, wherein each first row is substantially perpendicular to a desired direction of incompressible fluid flow; and
   a second plurality of pin fins having a second geometric cross section protruding from said surface, the second geometric cross section streamlining the incompressible fluid flows, wherein the second plurality of pin fins are arranged in second rows comprising only the second plurality of pin fins having the second geometric cross section, wherein each second row is substantially perpendicular to the desired direction of incompressible fluid flow,
   wherein the first and second rows are arranged in a repeated alternating pattern providing at least one first row followed downstream in the desired direction of incompressible fluid flow by at least two second rows,
   wherein the first plurality of pin fins causes turbulence in the incompressible fluid flow to increase a heat transfer efficiency of the apparatus while the second plurality of pin fins maintains the incompressible fluid flow in the desired direction of incompressible fluid flow and partially streamlines the incompressible fluid flow avoiding stagnation caused by turbulence in the incompressible fluid flow.

2. An apparatus for dissipating heat, comprising:
   a surface over which an incompressible fluid flows;
   a first plurality of pin fins having a first geometric cross section protruding from said surface, the first geometric cross section producing turbulence in the incompressible fluid flows, wherein the first plurality of pin fins are arranged in first rows comprising only the first plurality of pin fins having the first geometric cross section, wherein each first row is substantially perpendicular to a desired direction of incompressible fluid flow; and
   a second plurality of pin fins having a second geometric cross section protruding from said surface, the second geometric cross section streamlining the incompressible fluid flows, wherein the second plurality of pin fins are arranged in second rows comprising only the second plurality of pin fins having the second geometric cross section, wherein each second row is substantially perpendicular to the desired direction of incompressible fluid flow,
   wherein the first and second rows are arranged in a repeated alternating pattern providing one first row followed downstream in the desired direction of incompressible fluid flow by two second rows,
   wherein the first plurality of pin fins causes turbulence in the incompressible fluid flow to increase a heat transfer efficiency of the apparatus while the second plurality of pin fins maintains the incompressible fluid flow in the desired direction of incompressible fluid flow and partially streamlines the incompressible fluid flow avoiding stagnation caused by turbulence in the incompressible fluid flow.

* * * * *